United States Patent

[11] 3,634,731

[72] Inventor David G. Skogmo
Albuquerque, N. Mex.
[21] Appl. No. 61,569
[22] Filed Aug. 6, 1970
[45] Patented Jan. 11, 1972
[73] Assignee The United States of America as represented by the United States Atomic Energy Commission

[54] GENERALIZED CIRCUIT
3 Claims, 7 Drawing Figs.

[52] U.S. Cl. 317/101 A, 317/101 CC, 317/235 D
[51] Int. Cl. H01l 19/00
[50] Field of Search 307/207, 213; 317/101 A, 101 CM, 235; 174/DIG. 3

[56] References Cited

UNITED STATES PATENTS

| | | | |
|---|---|---|---|
| 3,388,301 | 6/1968 | James | 317/101 A |
| 3,478,229 | 11/1969 | Avery | 307/213 |
| 3,374,400 | 3/1968 | Tabuchi et al. | 174/DIG. 3 |
| 3,292,241 | 12/1966 | Carroll | 174/DIG. 3 |
| 3,484,932 | 12/1969 | Cook, Jr. | 317/101 A |
| 3,036,222 | 5/1962 | Witt | 307/207 |

*Primary Examiner*—David Smith, Jr.
*Attorney*—Roland A. Anderson

ABSTRACT: A circuit arrangement and packaging comprising a semiconductor chip with active circuit elements, passive circuit elements and means for interconnecting the elements for forming a generalized multifunction "incomplete" circuit arrangement for producing electrical current in response to input currents, the semiconductor chip also including a plurality of conductive members distributed in a preselected array about the semiconductor chip with some connected to the interconnecting means at locations adjacent the elements for forming inputs and outputs to the elements and other connected for crossover and crossunder networks; and a printed circuit board including a plurality of conductive lands in an array corresponding with the array of the conductive members and connected thereto in underlying fashion, printed circuit passive circuit elements disposed thereon, and printed circuit means for interconnecting the lands and the printed circuit passive elements and for providing a complete electronic circuit with the generalized multifunction circuit.

INVENTOR.
DAVID G. SKOGMO
BY
Roland A. Gudmundson
Attorney

INVENTOR.
DAVID G. SKOGMO
BY
Roland A. Anderson
Attorney

INVENTOR.
DAVID G. SKOGMO
BY
Roland A. Anderson
Attorney

GENERALIZED CIRCUIT

BACKGROUND OF INVENTION

Multipurpose generalized, or building block type electrical circuits are used in many circuit applications in various combinations or arrangements to provide some desired circuit function. Such multipurpose circuits are particularly useful in logic type applications in which gate circuits, OR circuits, AND circuits, flip-flops and the like are used. Since it is becoming increasingly necessary in many applications which utilize these circuits that the circuits be of small size, i.e., miniaturized, these multipurpose circuits are being produced on a single block or chip of semiconductor material as "integrated" circuits.

In these prior multipurpose integrated circuits, an arrangement of active elements, such as diodes and transistors, are positioned on a single chip of semiconductor material using masking and diffusion techniques together with passive circuit elements, such as resistance and capacitive elements, and interconnecting conductors to form the desired circuit. Because of the arrangements used, many of these multipurpose circuits have been limited as to the flexibility of design of the circuit in such areas as the power capacity of the multipurpose circuit, it is speed of operation, and its adaptability to a wide range of circuit applications.

One type of multipurpose integrated circuit arrangement utilized a standard arrangement of active and passive circuit elements on the semiconductor chip. When it is determined just what type of circuit or function is to be performed by this integrated circuit, a mask may be produced which provides conductive leads between the active and passive circuit elements in a desired circuit configuration to provide this function. The mask is then applied and a conductive layer appropriately deposited on the integrated circuit to form the complete circuit desired. If other circuit arrangements are desired a different mask and conductive film deposition is used on other multipurpose integrated circuit chips to achieve this new circuit arrangement. Because of the cost of the design of such maskings, unless significant quantities of each of the circuits are needed, the cost of the circuits may be quite high. Additionally, such masking techniques for integrated circuits, because of the materials and size involved, generally require a degree of expertise or capability available only to those in the business of manufacturing integrated circuits thus limiting the flexibility to a circuit user to modify the multipurpose circuit to his own needs.

SUMMARY OF INVENTION

In view of the above, it is an object of this invention to provide a novel multipurpose circuit having a wide range of applications.

It is a further object of this invention to provide a circuit packaging technique and arrangement utilizing this multipurpose circuit as an integrated circuit which provides for ready adaptability of the integrated circuit to a wide range of circuit functions and applications.

It is a still further object of this invention to provide a circuit packaging technique utilizing this generalized integrated circuit which is capable of using a wide range of passive circuit elements with the integrated circuit without modification of the integrated circuit itself.

Various other objects and advantages will appear from the following description of the invention, and the most novel features will be particularly pointed out hereinafter in connection with the appended claims. It will be understood that various changes in the details, materials and arrangements of the parts, which are herein described and illustrated in order to explain the nature of the invention, may be made by those skilled in the art.

The invention comprises a multipurpose integrated circuit arrangement having active and passive circuit elements and means interconnecting the elements to form an incomplete circuit and a packaging arrangement whereby the integrated circuit is provided with a preselected array of conductive members distributed about the integrated circuit connected to the interconnecting means at appropriate locations and a printed circuit board including a plurality of conductive lands in an array corresponding with the array of said conductive members and connected thereto in underlying fashion, printed circuit passive circuit elements disposed on the printed circuit boards and printed circuit means interconnecting the lands and the printed circuit passive elements for providing a complete electronic circuit with the integrated circuit.

DESCRIPTION OF DRAWING

The present invention is illustrated in the accompanying drawing wherein.

DETAILED DESCRIPTION

The present invention utilizes a generalized, multifunction integrated circuit having certain interconnected active elements which form an incomplete or only partially connected circuit generally incapable of performing any useful function together with printed circuits having the necessary passive elements to complete the circuit and a packaging technique to effectively couple the integrated and printed circuits to form a complete functioning electronic circuit. The circuit arrangement on the printed circuit determines the functioning of the overall circuit, i.e., whether the overall circuit will be a gate circuit, a flip-flop, an oscillator or the like.

Figure 1:
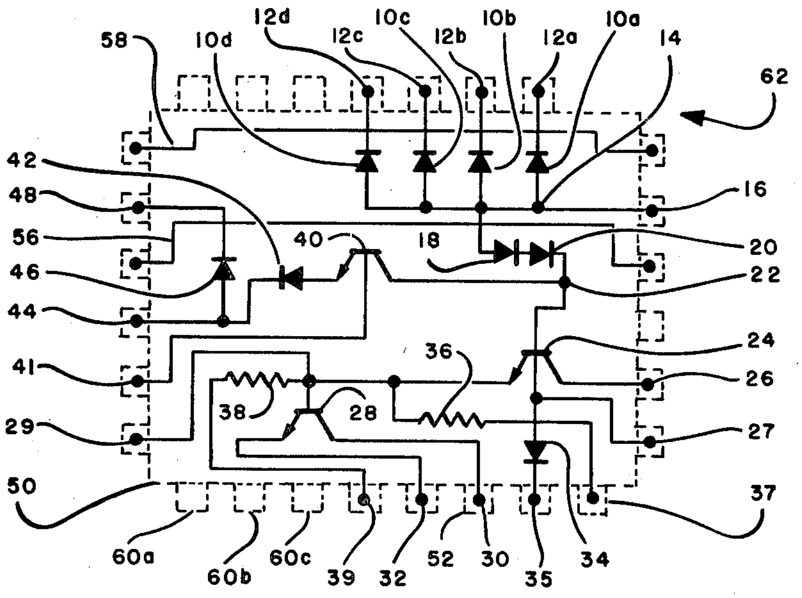
FIG. 1 is a schematic diagram of the generalized, multifunction circuit of this invention.

The generalized, multifunction circuit, as shown in FIG. 1, comprises a group of parallel connected input diodes **10*a*, 10*b*, 10*c* and 10*d* having their cathodes connected to separate input terminals 12*a*, 12*b*, 12*c* and 13*d* and their anodes commonly connected to junction 14 so as to function as gate diodes. Junction 14 is coupled by suitable interconnecting means or conductors to terminal 16. Terminal 16 may be used together with another generalized, multifunction integrated circuit and its input diodes or other separate diodes as an input expansion terminal for additional gate inputs and/or it may be used as a biasing terminal for particular circuit applications. Junction 14 may also be connected to the anode of one or more series connected offset diodes 18 and 20**. As the number of offset diodes is increased, the noise immunity of the circuit may be increased.

The cathode of the last offset diode, diode 20 as shown, is coupled to a junction 22 which in turn is coupled to the base of driver transistor 24. Driver transistor 24 may be appropriately biased at its collector through terminal 26 with the emitter thereof connected to the base of output transistor 28. Terminal 26 may be returned directly or through a resistor to a supply voltage or connected to the center tap of an output pull up resistor, depending on the desired application. The base of driver transistor 24 may be connected to a junction terminal 27. The collector of output transistor 28 may be connected to output terminal 30 with the emitter thereof connected through terminal 32 to ground or an appropriate bias. The base of output transistor 28 may be connected to a suitable junction terminal 29.

If desired, a compensating diode 34 may be coupled between the base of driver transistor 24 and a junction terminal 35, in some circuit applications the collector of output transistor 28 or any other desired circuit location to clamp the output out of saturation and increase the switching speed of the circuit and decrease the circuit sensitivity to radiation. The circuit switching speed may also be increased by providing base-emitter shunt resistors for driver transistor 24 and output transistor 28, such as resistors 36 and 38 which may be connected to junction terminals 37 and 39, respectively. When forming a part of the generalized, multifunction integrated circuit, the shunt resistors 36 and 38 may be diffused resistors having appropriate resistances, such as about 10,000 ohms and 2,500 ohms, respectively. As the resistance is increased or eliminated, circuit switching speed may be decreased.

A steering transistor 40 may be connected to the generalized, multifunction circuit with its collector coupled to terminal 22 and its base coupled to a junction terminal 41. The emitter of steering transistor 40 may be coupled through an offset diode 42 to steering terminal 44. Offset diode 42 may thus provide base-emitter protection from breakdown. Input-output isolation may be provided by a diode 46 and terminal 48 for use in flip-flop and the like circuits.

Figure 2:
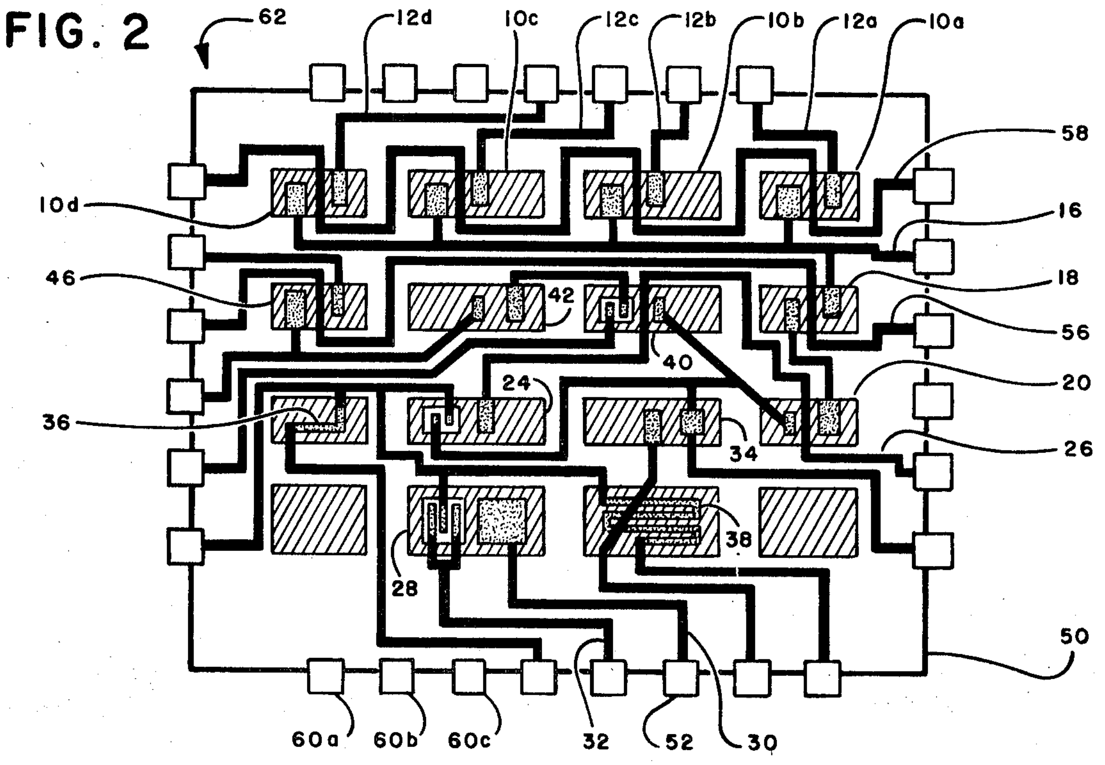
FIG. 2 is a greatly enlarged plan view of a typical integrated circuit chip showing an arrangement of elements of the circuit of FIG. 1.
Figure 3:
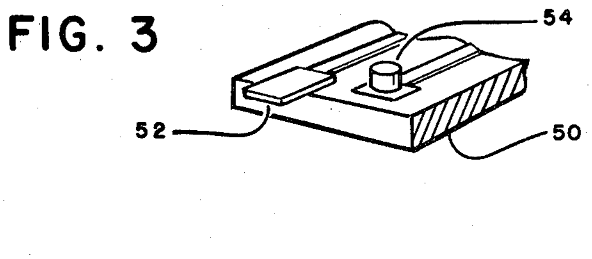
FIG. 3 is an enlarged fragmentary perspective view showing a conductive "beam" and a conductive "bump"

The generalized, multifunction circuit shown in FIG. 1 may be disposed in any appropriate manner on a single block or chip of semiconductor material to form an integrated circuit as shown by the dotted lines of elements described below. A typical circuit arrangement on a semiconductor chip 50 is shown in FIG. 2. The various terminals and junctions of the circuit may be connected to appropriate conductive members which are distributed in a preselected array about the semiconductor chip 50 with some connected to the interconnecting means or conductors adjacent the active elements or inactive elements of the circuit to form terminals or junctions and inputs and outputs to the elements. As a generalized, multifunction integrated circuit, the array or pattern of conductive members utilized should be the same for every circuit used, as will be apparent from the description below. Particularly appropriate conductive members are conductive beams which extend from marginal portions of semiconductor chip 50, as shown in FIG. 2 and in greater detail in FIG. 3 by a beam 52 which is connected, for example, to output terminal 30 by brazing, welding or the like. Conductive bumps, such as shown by bump 54 in FIG. 3 may be used along the marginal portions of the semiconductor chip 50 or at any location thereon either alone or together with conductive beams in a suitable array, depending on the desired circuit application. Crossover conductors may be provided from one side of the semiconductor chip to the other for circuit interconnection convenience, such as shown by crossover conductors 56 and 58. As will become apparent below, additional conductive members, such as members 60*a*, 6*b* and 60*c* may be provided for crossunder networks or other interconnecting uses. It may also be desirable to provide a keying break in the pattern or array of conductive members, such as shown at 62, to provide an orientation marker for the integrated circuit.

With the arrangement shown, a semiconductor chip may be utilized having dimensions of about 45 mils by 60 mils with conductive beam array shown having conductive beams about 4 by 5 mils in size. The semiconductor chip 50 may be made of any appropriate material with appropriate semiconductor islands situated thereon in a manner well known in the art.

It can be readily seen that the generalized, multifunction circuit and integrated circuit described in FIGS. 1 and 2 is incomplete in its present state and incapable of performing any useful function without additional circuit and biasing connections to appropriate terminals or junctions thereof. It can also be seen, that the circuit does not include, at this point, any resistors which would be a limiting or a determining factor in setting the power limits of the circuit or which would require significant heat dissipation or produce sufficient heat to be detrimental to circuit operation. Further, the circuit does not include any capacitive or inductive elements.

For purpose of illustration, semiconductor chip 50 is shown having one of the generalized, multifunction circuits shown in FIG. 1. If the circumstances warrant it, the semiconductor chip may be provided with two or more of the generalized, multifunction circuits appropriately distributed on a semiconductor chip with some preselected array or pattern of conductive members.

Figure 4:
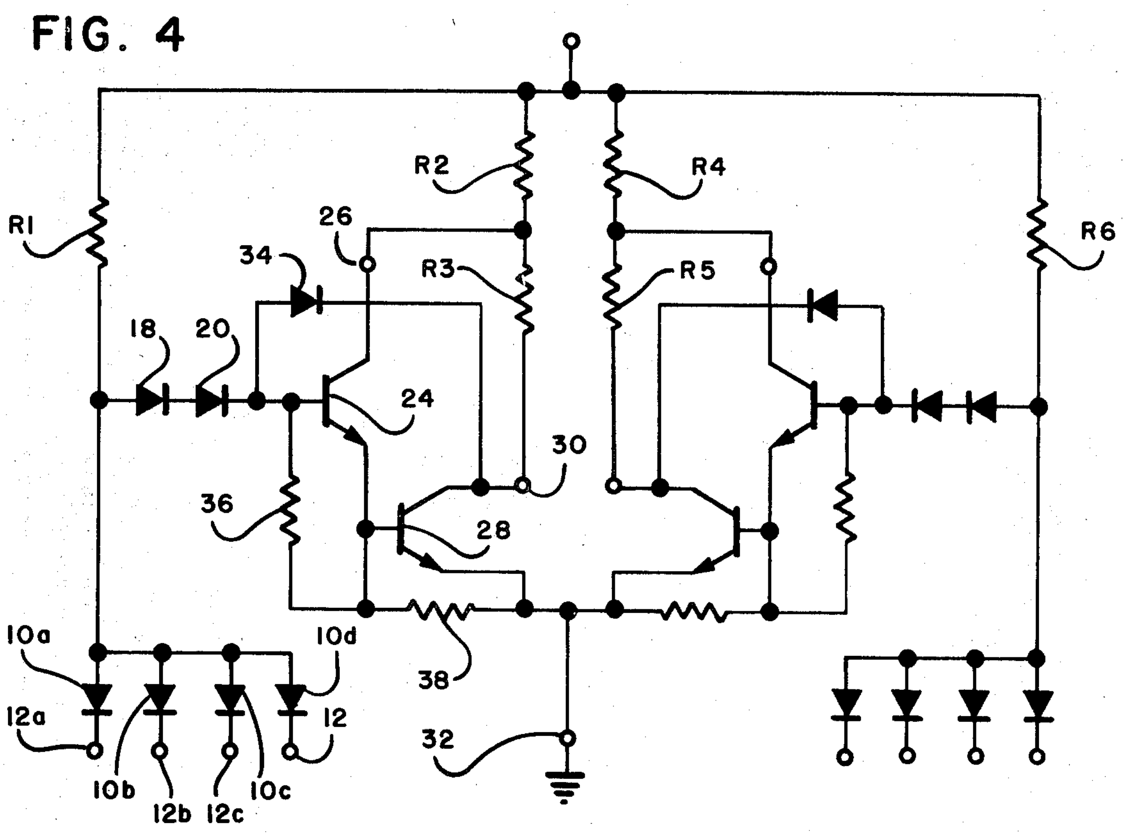
FIG. 4 is a schematic diagram of a dual gate circuit.

A dual gate circuit, which may utilize the generalized, multifunction integrated circuit of this invention, is shown in FIG. 4. The elements of the circuit which correspond with the elements of the generalized, multifunction integrated circuit are labeled for the left-hand gate with each side of the gate being identical. In order to complete the integrated circuit to form a complete functioning circuit appropriate biases must be connected to the integrated circuit at appropriate terminals and through suitable resistors R1, R2, and R3 for the left-hand gate and R4, R5, and R6 for the right-hand gate. R1 and R6 act as base bias resistors while R2, R3, R4 and R5 act as center-tapped pull up resistors. R2, R3, R4 and R5 may typically be about 500 ohm resistors while R1 and R6 may be typically about 2,000 ohms.

Figure 5:
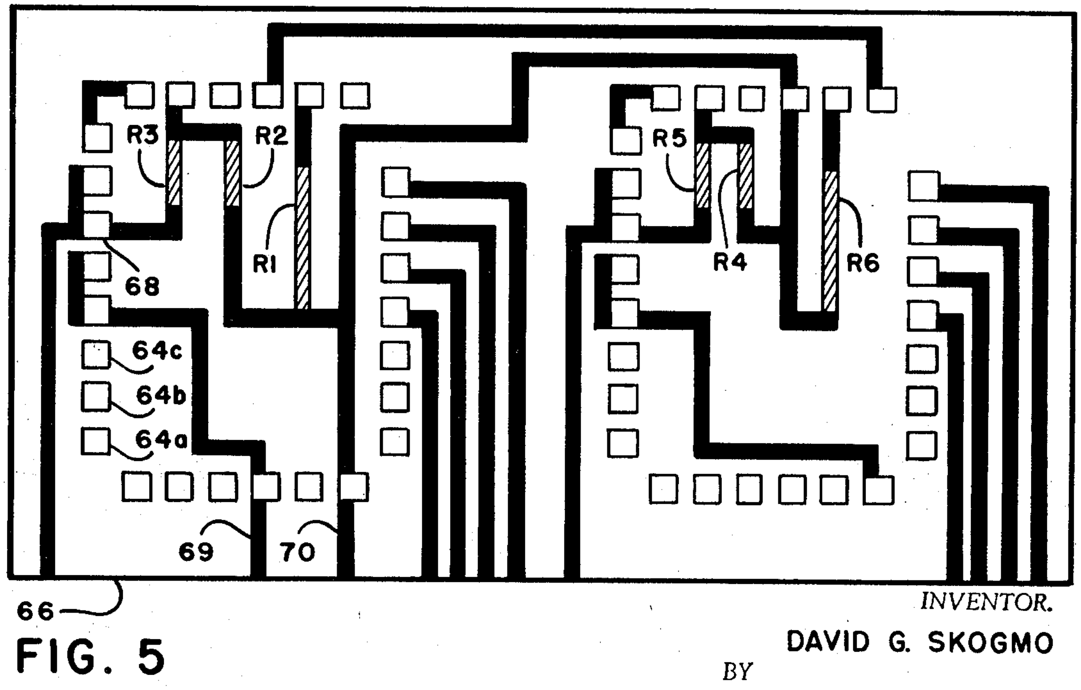
FIG. 5 is a plan view of a printed circuit arrangement which together with the generalized integrated circuit of FIGS. 1 and 2 forms the dual gate circuit of FIG. 4.

The dual gate circuit of FIG. 4 may be formed, in accordance with this invention, using the multipurpose circuit of FIG. 1 and the integrated circuit of FIG. 2 with a printed circuit and packaging technique, illustrated in FIG. 5.

A plurality of conductive lands, such as lands 64*a*, 64*b* and 64*c* is disposed on an appropriate printed circuit board 66 in an array corresponding with the array or pattern of conductive members (either conductive beams or conductive bumps) of the integrated circuit so that the integrated circuit may be coupled to printed circuit passive circuit elements on printed circuit board 66 through the lands and conductive members, generally by turning the semiconductor chip over so that the conductive members make physical contact with the lands. For example, conductive lands 64*a*, 64*b* and 64*c* may correspond with and be connected to conductive beams 60*a*, 60*b* and 60*c* of FIG. 2 with conductive land 68 corresponding with conductive beam 50, and so on. The generalized, multifunction integrated circuit may be fastened to the printed circuit, using the orientation marker to insure correct alignment, by any appropriate welding, contact solder, brazing or the like techniques. The resistors R1 through R6 may be appropriately deposited on printed circuit board 66 as printed circuit resistance elements together with appropriate printed circuit conductive means interconnecting the resistors and lands to complete the circuit. Additional printed circuit conductive leads may be connected to appropriate lands and terminals on the printed circuit board 66 to provide input and output connections as well as bias connections from a voltage supply (not shown) to the integrated circuits and active and inactive elements, and to interconnect the integrated circuits to form the complete dual gate circuit. For example, ground may be connected to lead 69 and a bias voltage connected to lead 70. Additional conductive land arrays and circuit arrangements may be disposed on printed circuit board 66 and interconnected with the dual gate circuit and other circuits, as desired.

Figure 6:
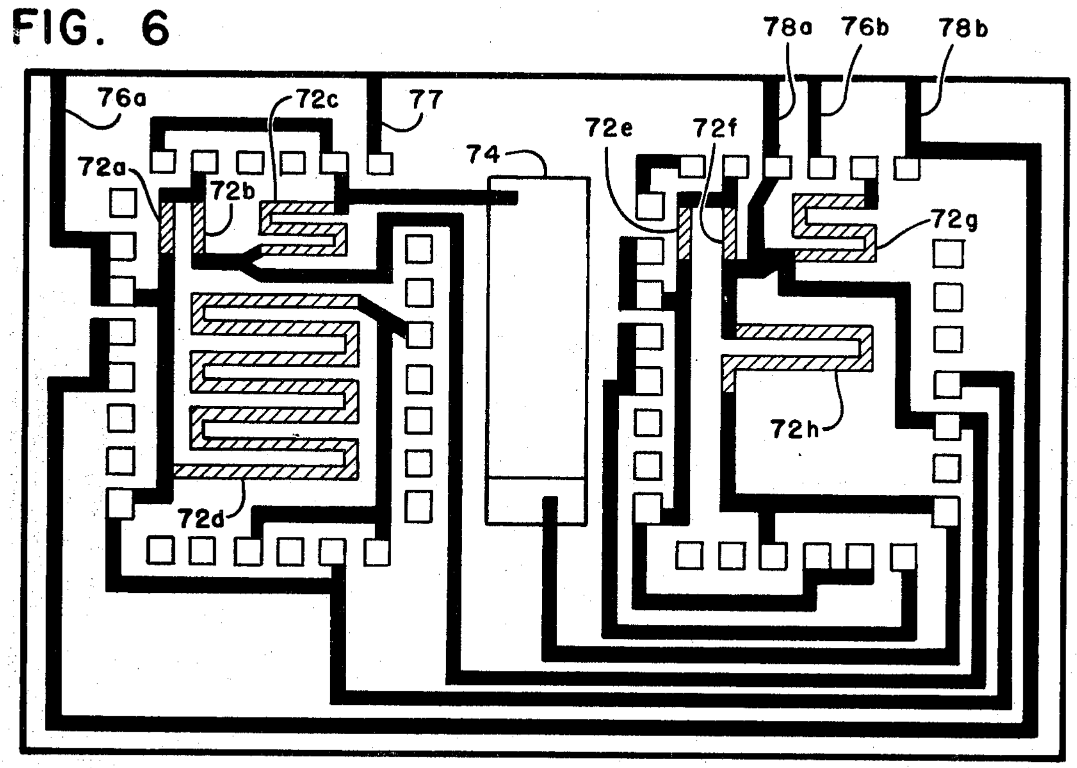
FIG. 6 is a plan view of a printed circuit board showing a single shot multivibrator circuit which is used in conjunction with the circuit of FIGS. 1 and 2.
Figure 7:
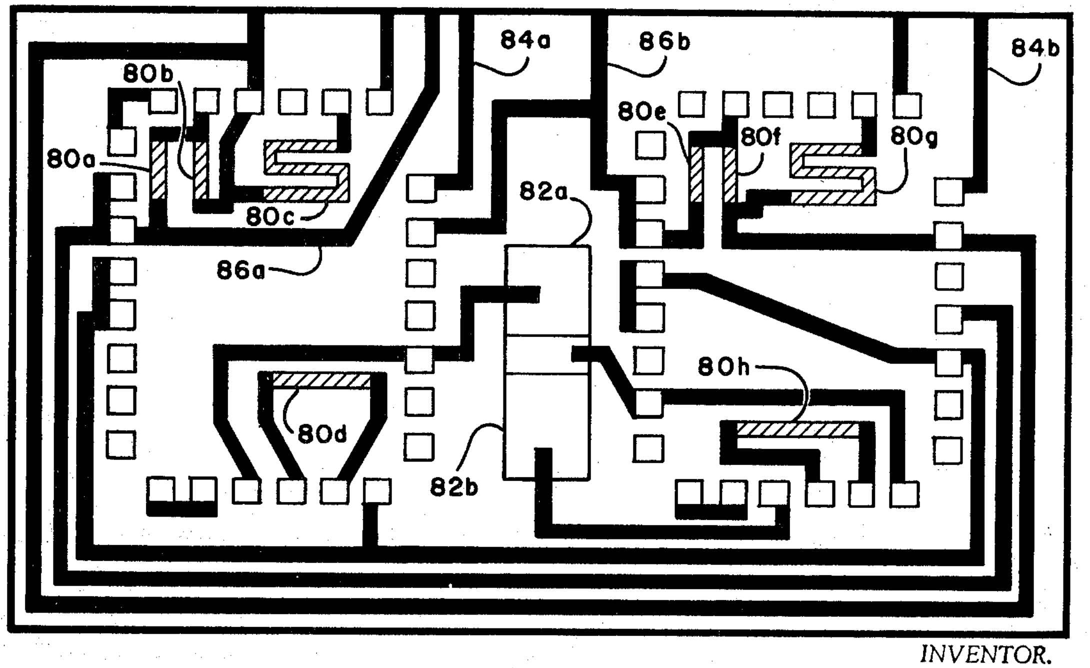
FIG. 7 is a plan view of a printed circuit for use with the generalized integrated circuit as a flip-flop.

As shown in FIG. 6, a pair of arrays of conductive lands corresponding to the array of conductive members on the generalized, multifunction integrated circuit together with appropriate printed circuit conductive leads, resistors 72*a* through 72*h* having suitable resistance values and a capacitor or capacitance element 74 may provide a single shot pulse generator circuit which will produce an output pulses at terminals 76*a* and 76*b* upon receipt of an input pulse at terminal 77 when the circuit is suitably biased through terminals 78*a* and 78*b*. Likewise, a flip-flop circuit and operation may be achieved with the conductive land array and printed circuit arrangement shown in FIG. 7. This circuit may include appropriately connected resistors 80*a* through 80*h* having suitable resistance values, and capacitors 82*a* and 82*b* having suitable capacitance values. Inputs may be provided at terminals 84*a* and 84*b* with outputs at terminals 86*a* and 86*b* and with appropriate biases applied to the other terminals.

With such an arrangement, the printed circuit boards may be provided with appropriate heat dissipation means to conduct any excess heat generated by resistors deposited thereon away from the circuit so as not to adversely effect the operation of the integrated circuit elements. Further, for different applications, the power requirements or the various circuits may be adjusted by appropriate selection of resistance values on the printed circuit board without affecting or changing the generalized, multifunction integrated circuit. In this manner the circuits may be tailored for different applications and uses without modification of the integrated circuit itself. Any changes which must be made or any adjustments to circuits may be made simply by changing the printed circuit. With the ability to select power consumption in separate circuits, the overall power consumption of a system may be reduced and thereby also reduce system noise level.

Because of the simplicity of the generalized, multifunction integrated circuit, it may be readily tested for circuit operation and continuity as a separate component. The printed circuits which are designed to provide the completed circuit may also be readily tested for continuity and operation.

I claim:

1. The combination comprising a semiconductor chip having mounted thereon active circuit elements, resistor passive circuit elements and means for interconnecting said elements for forming a generalized multifunction incomplete integrated circuit arrangement for producing electrical currents in response to input currents, said active circuit elements of said semiconductor chip include a plurality of parallel connected input gate diodes, a plurality of series connected first offset diodes, a driver transistor, an output transistor, a compensating diode, a steering transistor, a second offset diode and an isolation diode, said interconnecting means include an input terminal for each of said input diodes, bias terminals for said driver transistor and said output transistor, an output terminal, an input expansion and biasing terminal, a steering terminal, and junction terminals, said interconnecting means also includes conductive elements connecting the anodes of said gate diodes to a common junction in series with the anodes of said offset diodes, the base of said driver transistor with the cathodes of said offset diodes and to a first junction terminal, the base of said output transistor with the emitter of said driver transistor and to a second junction terminal, each of said input terminals to a cathode of said gate diodes, the collector of said driver transistor to a first bias terminal, the emitter of said output transistor to a second bias terminal, the collector of said output transistor to said output terminal, the anode of said compensating diode to the base of said driver transistor, the cathode of said compensating diode to a third junction terminal, the collector of said steering transistor to the base of said driver transistor, the base of said steering transistor to a fourth junction terminal, the anode of said second offset diode to the emitter of said steering transistor, the cathode of said second offset diode to the anode of said isolation diode and to said steering terminal, the cathode of said isolation diode to a fifth junction terminal, and said input expansion and biasing terminal to the junction of said gate diodes and said first offset diodes, said passive circuit elements include resistance elements connected between the emitter of said driver transistor and a sixth junction terminal and between the base of said output transistor and a seventh junction terminal, said semiconductor chip also including a plurality of conductive members distributed in a predetermined array about said semiconductor chip, means for connecting each of said terminals to a separate of said conductor members for forming inputs and outputs to said elements and for connecting additional conductive elements for crossover and crossunder networks; and a printed circuit board including a plurality of conductive lands in an array corresponding with the array of said conductive members and connected thereto in underlying fashion, printed circuit passive circuit elements disposed thereon, and printed circuit means for interconnecting said lands and said printed circuit passive elements and for providing a complete electronic circuit with said integrated circuit.

2. The combination of claim 1 wherein said conductive members are in excess of said terminals and said array of conductive members includes a keying break in the pattern thereof.

3. The combination of claim 1 including a plurality of said semiconductor chips mounted on said printed circuit board on separate arrays of said conductive lands.

* * * * *